US006982214B2

(12) United States Patent
Fu et al.

(10) Patent No.: US 6,982,214 B2
(45) Date of Patent: Jan. 3, 2006

(54) METHOD OF FORMING A CONTROLLED AND UNIFORM LIGHTLY PHOSPHOROUS DOPED SILICON FILM

(75) Inventors: Li Fu, Santa Clara, CA (US); Sheeba J. Panayil, Santa Clara, CA (US); Shulin Wang, Campbell, CA (US); Christopher G. Quentin, Fremont, CA (US); Lee Luo, Fremont, CA (US); Aihua Chen, San Jose, CA (US); Xianzhi Tao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/263,105

(22) Filed: Oct. 1, 2002

(65) Prior Publication Data

US 2004/0063301 A1    Apr. 1, 2004

(51) Int. Cl.
H01L 21/20    (2006.01)
(52) U.S. Cl. .................................... 438/508
(58) Field of Classification Search ................ 438/491, 438/495, 499, 501, 505, 508, 514, 542, 766, 438/914
See application file for complete search history.

(56) References Cited

U.S. PATENT DOCUMENTS

| 5,316,958 | A | * | 5/1994 | Meyerson ..................... 117/88 |
| 5,518,942 | A | | 5/1996 | Shrivastava |
| 5,597,754 | A | | 1/1997 | Lou et al. |
| 5,607,724 | A | * | 3/1997 | Beinglass et al. ..... 427/255.393 |
| 5,614,257 | A | * | 3/1997 | Beinglass et al. ........ 427/248.1 |
| 5,693,139 | A | | 12/1997 | Nishizawa et al. |
| 5,869,389 | A | * | 2/1999 | Ping et al. .................. 438/486 |
| 6,127,221 | A | | 10/2000 | Lin et al. |
| 6,130,145 | A | | 10/2000 | Ilg et al. |
| 6,211,020 | B1 | | 4/2001 | Tripsas et al. |
| 6,232,196 | B1 | | 5/2001 | Raaijmakers et al. |
| 6,248,629 | B1 | | 6/2001 | Liu et al. |
| 6,316,298 | B1 | | 11/2001 | Lee |
| 6,333,266 | B1 | * | 12/2001 | Sugiyama ................... 438/684 |
| 6,342,421 | B1 | | 1/2002 | Mitani et al. |
| 6,368,913 | B1 | | 4/2002 | Yamamoto |
| 6,376,319 | B2 | | 4/2002 | Ang et al. |
| 6,380,032 | B1 | | 4/2002 | Lee et al. |
| 6,403,455 | B1 | | 6/2002 | el-Hamdi et al. |

OTHER PUBLICATIONS

Wolf, S. "Silicon Processing for the VLSI Era, vol. 2—Process Integration", 1990, section 9.2.3.2, pp. 665-666.*
Pejnefors et al., Hydrogen in Undoped and Heavily in situ Phosphorous Doped Silicon Films Deposited Using Disilane and Phosphine, Journal of Applied Physics, vol. 86, No. 4, Aug. 15, 1999, pp. 1970-1973.*
Sarret et al., Low Pressure Chemical Vapor Deposition of Low in situ Phosphorous Doped Silicon Thin Films, Applied Physics Letters, vol. 59, No. 12, Sep. 16, 1991, pp. 1438-1439.*

* cited by examiner

*Primary Examiner*—Ha Nguyen
*Assistant Examiner*—Scott Geyer
(74) *Attorney, Agent, or Firm*—Blakely Sokoloff Taylor & Zafman

(57) ABSTRACT

Method of forming a lightly phosphorous doped silicon film. A substrate is provided. A process gas comprising a phosphorous source gas and a disilane gas is used to form a lightly phosphorous doped silicon film on the substrate. The diluted phosphorous source gas has a phosphorous concentration of 1%. The phosphorous source gas and the disilane gas have a flow ratio less than 1:100. The lightly phosphorous doped silicon film has a phosphorous doping concentration less than $1 \times 10^{20}$ atoms/cm$^3$.

15 Claims, 7 Drawing Sheets

METHOD OF FORMING A CONTROLLED AND UNIFORM LIGHTLY PHOSPHOROUS DOPED SILICON FILM

BACKGROUND OF THE INVENTION

1). Field of the Invention

This invention relates generally to a semiconductor processing method, and more specifically to the manufacture of a lightly phosphorous doped silicon film that can be incorporated into a semiconductor device.

2). Discussion of Related Art

Integrated circuits are usually manufactured in and on silicon and other semiconductor substrates or wafers. Most often, silicon is used as the substrate for these integrated circuits. Silicon is also often used to fabricate the associated circuit elements. Circuit elements such as transistor gate electrodes, transistor gate dielectrics, and capacitor electrodes are made out of silicon. For example, a transistor typically has a gate dielectric film and a gate electrode, which is formed on the gate dielectric film, which is formed on a silicon substrate. The gate electrode is doped with a dopant such as boron, phosphorus, or arsenic. The substrate is subsequently heated to activate the dopant and make the electrode conductive.

Doping the circuit elements after the formation step increases cost. Insitu doping such as insitu phosphorous doped silicon films have been used in the making of many circuit elements, for example, in making gate electrodes, silicide stacks and floating gates. Insitu doping indicates that the films (or silicon films) are doped as they are being formed in the same process and in the same deposition chamber. Conventionally, silane or monosilane ($SiH_4$) is normally used as a silicon source and phosphine ($PH_3$) is used as dopant source for the insitu deposition of the phosphorous-doped silicon film.

In one embodiment, the fabrication of a phosphorous-doped silicon film is carried out in a conventional batch type chemical vapor deposition system. Such a system typically involves a hot wall furnace system, which includes a resistance furnace, a quartz reactor tube, some gas inlets, and a wafer boat that allows for processing of multiple wafers at the same time. Typically, multiple silicon wafers are vertically positioned upon the wafer boat for deposition. The wafers are radiantly heated by resistive heating coils surrounding the tube. Reactant gases are metered into one end of the tube (through some gas inlets using a mass flow controller). Reaction by-products are pumped out the other end of the tube (e.g., via an exhaust pump). Fabrication in batch limits the ability of varying the dopant concentration between wafers. It is also much more difficult to customize the film forming process for particular applications. Additionally, if anything goes wrong during the deposition process, a large batch of substrates are damaged and rendered useless.

One disadvantage of the conventional methods of insitu doping is that it is difficult to control dopant concentration especially in forming the lightly doped film. Another disadvantage is that the lightly doped film is not uniform.

Some current methods have used disilane ($Si_2H_6$) as the silicon source and phosphine ($PH_3$) as the dopant source for the insitu deposition of the phosphorous-doped silicon film in a single-wafer deposition chamber. See for example, U.S. Pat. Nos. 5,607,724 and 5,614,257, assigned to Applied Materials, Inc. These methods did not discuss the non-uniform problem for the phosphorous doping concentration in a lightly-doped silicon film.

SUMMARY OF THE INVENTION

According to an aspect of the invention, an insitu lightly phosphorous doped silicon film is formed in a single-wafer deposition chamber using disilane and phosphine as reactant gases.

A substrate is provided. A process gas comprising a phosphorous source gas and a disilane gas is used to form a lightly phosphorous doped silicon film on the substrate. The diluted phosphorous source gas has a phosphorous concentration of 1%. The phosphorous source gas and the disilane gas have a flow ratio less than 1:100. The lightly phosphorous doped silicon film has a phosphorous doping concentration less than $1\times10^{20}$ atoms/$cm^3$.

BRIEF DESCRIPTION OF THE DRAWINGS

The present invention is further described by way of examples with reference to the accompanying drawings, wherein.

DETAILED DESCRIPTION OF THE INVENTION

Figure 1:
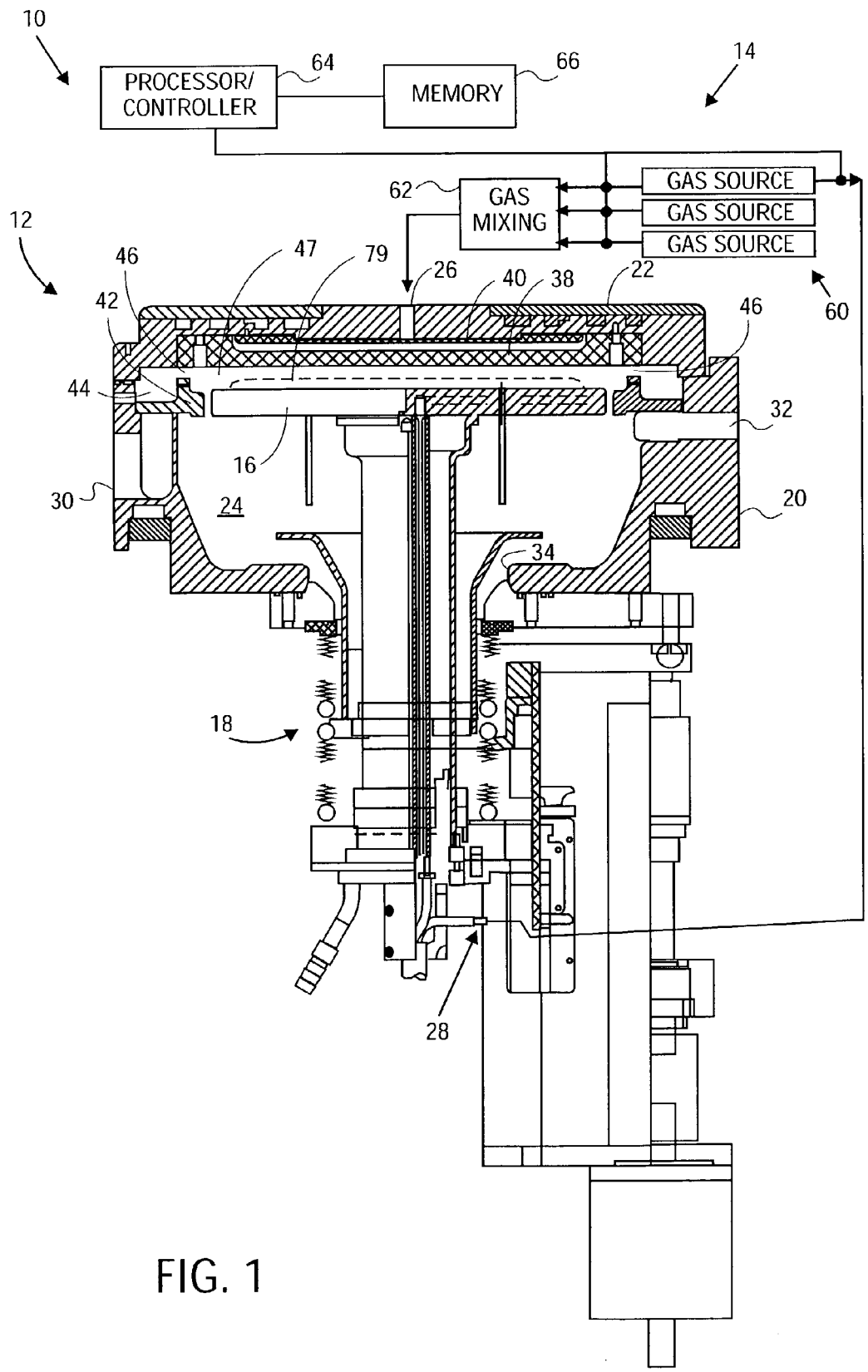
FIG. 1 illustrates a cross-sectional side view of an exemplary semiconductor processing system that is used for carrying out embodiments of the present invention.

The present invention includes a novel method of forming a lightly phosphorous doped comprising film in a single-wafer deposition chamber using a disilane ($Si_2H_6$) source gas and a phosphorous source gas such as phosphine ($PH_3$). In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting the invention.

This discussion relates to forming a lightly phosphorous doped silicon film. The lightly phosphorous doped silicon film can be a monocrystalline, a polycrystalline film, or an amorphous film. Additionally, the lightly phosphorous doped silicon film may include other silicon comprising film that can be doped with phosphorous, for example, silicon germanium.

In one embodiment, a lightly phosphorous dopes silicon film is formed on a substrate. The lightly phosphorous dopes silicon film is formed under a process pressure between 30 Torr and 350 Torr and a process temperature between 500° C. and 650° C. A process gas mixture comprising a disilane gas and a phosphorous source gas is used to form the lightly phosphorous dopes silicon film. In one embodiment, the phosphorous source gas is a diluted phosphorous source gas containing 1% phosphorous and 99% hydrogen ($H_2$) gas. In this example, the 1% diluted phosphorous source gas and the disilane gas have a flow ratio between 1:10 to 15:10. In an embodiment where the phosphorous source gas is not diluted, the phosphorous source gas and the disilane gas have a flow ratio less than 1:100. In one embodiment, the disilane gas and the phosphorous source gas are thermally decomposed to form the lightly phosphorous doped silicon film.

The lightly phosphorous doped silicon film formed in accordance with the present invention has a phosphorous doping concentration less than $1\times10^{20}$ atoms/cm$^3$. The lightly phosphorous doped silicon film is also uniform or substantially uniform. The phosphorous doping concentration across the substrate is also uniform. The lightly phosphorous doped silicon film has a low dopant concentration yet, a higher amount of the phosphorous source gas can be used. When the process gas mixture includes a disilane gas, the amount of the phosphorous source gas that can be used to form the lightly phosphorous dopes silicon film is about one (1) magnitude higher than typically required when the process gas mixture includes monosilane. This is particularly useful for forming the film with lightly phosphorous doped dopant since being able to use more phosphorous source gas makes it easier to control the flow rate of the phosphorous source gas. The doping concentration is thus much easier to control, and the dopant in the film is much more uniform.

In one embodiment, a single wafer deposition chamber is used to form the lightly phosphorous doped silicon film. An example of such a single wafer deposition chamber is described below (See FIG. 1).

FIG. 1 illustrates an exemplary semiconductor processing system 10 that is used for carrying out the exemplary methods of the present invention (see below). The system 10 includes a low-pressure chemical vapor deposition chamber 12, a gas supply apparatus 14, a susceptor 16, and a susceptor elevating apparatus 18.

The chamber 12 is a single-wafer deposition chamber. The chamber 12 is also a resistively heated single wafer deposition chamber. The chamber 12 can also be a cold-wall chamber in which a coolant fluid is supplied to a container (not shown) surrounding the wall of the chamber 12 to prevent the chamber 12 from getting too hot. With the reactant gases and the temperature in the range of 500° C. or 650° C. or even higher, being processed in the chamber 12, the chamber 12 may be easily corroded unless made out of a corrosion resistant material, which is often expensive. With the cold-wall feature, the chamber 12 does not need to be made out of such an expensive material that is corrosion resistant. The chamber 12 can be made out of an aluminum alloy or other suitable metal.

The chamber 12 includes a lower body 20 and a lid 22. The lid 22 seals peripherally with an upper extremity of the body 20. The body 20 and the lid 22 jointly define an inner volume 24 of approximately five to seven liters. A first gas inlet port 26 is formed through a center of the lid 22. A second gas inlet port 28 is formed into a base of the susceptor elevating apparatus 18 and leading directly into the bottom side of the chamber 12. A gas outlet port 30 is formed in a side of the body 20. The body 20 also has a slit valve opening 32 in one side thereof, and a susceptor elevating apparatus opening 34 in a base thereof.

A gas dispersion plate 38 or "shower head" is mounted below the lid 22. Surfaces of the lid 22 and the gas dispersion plate 38 jointly define a thin horizontal cavity 40. The gas dispersion plate 38 has a multitude of openings (not shown) formed therethrough that place the cavity 40 in communication with the inner volume 24.

A gas accumulation ring (or "pumping plate") 42 is mounted within the chamber 12. The gas accumulation ring 42 and the surfaces of the chamber 12, define a ring volume 44. Gas outlet openings 46 are formed as an open gate between the pumping plate 42 and the dispersion plate 38. The ring volume 44 is in communication with the gas outlet port 30.

A process gas or gases can flow through the first gas inlet port 26 into the cavity 40. In one embodiment, the process gas or gases include a process gas mixture containing a disilane gas and a phosphorous source gas to form the lightly phosphorous dopes silicon film. The process gas or gases may also include other type of gas mixtures that will deposit other films on a substrate or otherwise treat or clean the substrate or clean the chamber 12. Gas then flows radially within the cavity 40. The gas or gases can then flow through the openings in the gas dispersion plate 38 into the inner volume 24. More process gas can enter through the second gas inlet port 28 into the inner volume 24. Typically, only a purging gas or an inert gas such as nitrogen ($N_2$) gas is introduced to the inlet port 28. The reactant gases are introduced through the inlet port 26. Introducing the inert gas through the inlet port 28 during the film deposition process prevents undesirable deposition on the bottom side of the chamber 12. The process gas or gases can exit the inner volume 24 through the gas outlet openings 46, be accumulated in the ring volume 44, and subsequently be pumped out through the gas outlet port 30.

Figure 2:
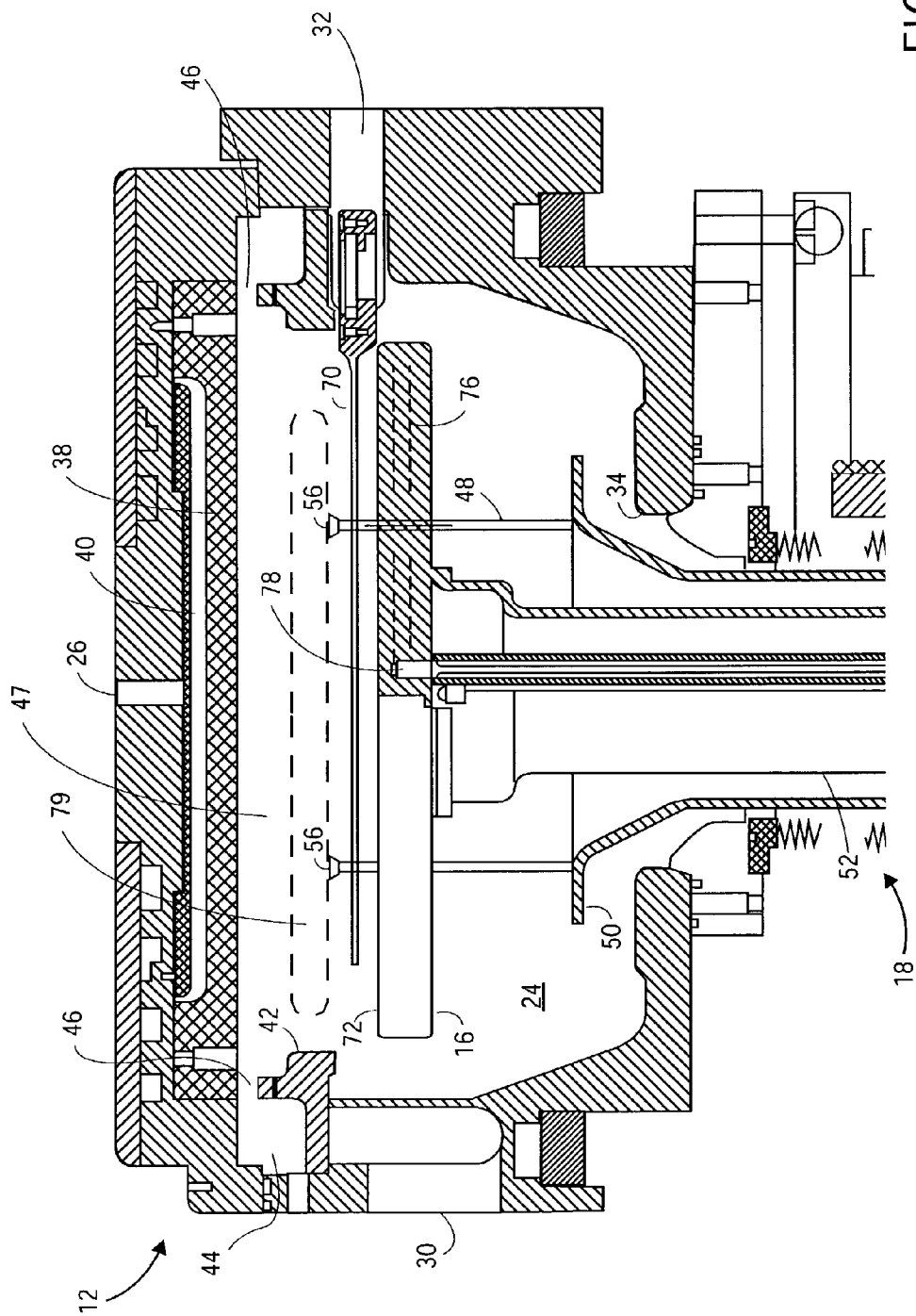
FIG. 2 illustrates an enlarged view of an exemplary chamber and internal components of the chamber.

Referring to FIG. 2, the elevating apparatus 18 includes a set of elevating pins 48, a pin elevator 50, and a susceptor elevator 52. The pin elevator 50 and the susceptor elevator 52 are tubular members that extend through the apparatus opening 34 into the inner volume 24. The susceptor elevator 52 is, for the most part, located within the pin elevator 50. A portion of the susceptor elevator 52 extends out of an upper end of the pin elevator 50. A susceptor 16 is mounted to an upper end of the susceptor elevator 52. The susceptor is used to support a substrate 79 (shown in outline form in FIGS. 1 and 2). Vertical movement of the susceptor elevator 52 causes vertical movement of the susceptor 16.

The pins 48 extend through openings (not shown) in the susceptor 16. Each pin 48 has a head 56 at an upper end thereof. The pin elevator 50 engages with lower ends of the pins 48. Vertical movement of the pin elevator 50 causes vertical movement of the pins 48 relative to the chamber 12. The pins 48 also move relative to the susceptor 16, assuming that the susceptor 16 is stationary.

Referring again to FIG. 1, the gas supply apparatus 14 includes a gas bank 60 and a gas-mixing manifold 62. The gas supply apparatus 14 further couples to a processor/controller 64, and memory 66. The gas bank 60 has number of different gas sources. In one embodiment, the gas sources include nitrogen gas ($N_2$), disilane ($Si_2H_6$) gas, and a phosphorous source gas such as a phosphine ($PH_3$) gas. In another embodiment, other carrier/dilution gases such as helium (He) gas, hydrogen ($H_2$) gas, nitrogen ($N_2$) gas, xenon (Xe) gas, and argon (Ar) gas, can be included in the gas sources. Each of the gas sources is connected through a respective valve (not shown) to the gas-mixing manifold 62. The gas-mixing manifold 62 is connected to the first gas inlet port 26. In one embodiment, an inert gas such as an $N_2$ gas is also connected through a valve (not shown) to the second gas inlet port 28.

In one embodiment, the processor/controller 64 controls operations of the gas bank 60. The processor/controller 64 is connected to the valves through which the gases can exit the gas bank 60 and enter the chamber 12. The processor/controller 64 can operate each valve independently so as to open or close flow from a respective gas source to either the gas-mixing manifold 62 or to the second gas inlet port 28. The memory 66 is connected to the processor/controller 64. A program or a set of instructions stored in the memory 66 and read by the processor/controller 64 can be used to control the operations of the gas bank 60. The valves can thus be opened or closed according to the instructions stored in the memory 66.

In one embodiment, the processor/controller 64 also controls operations of the semiconductor processing system 10. For example, the processor/controller 64 executes a program stored in the memory 66 wherein the program further controls the process temperature (e.g., between 500–650° C.), process pressure (e.g., between 30–350 Torr), and the loading and unloading of a substrate into the chamber 12. In one embodiment, the program controls the dilution of the phosphorous source gas to be between 0.1% and 10%. In yet another embodiment, the program controls a flow ratio for the diluted phosphorous source gas and the disilane gas (e.g., a flow ratio of 1:10 to 15:10 of a 1% diluted phosphorous source gas to the disilane gas).

Referring to FIG. 2, when in use, a substrate 79 is located on a transfer blade 70 and then be transported on the transfer blade 70 through the slit valve opening 32 into the inner volume 24 of the chamber 12. The substrate 79 can be inserted into the chamber 12 using a robot assembly.

To load a substrate (e.g., the substrate 79), the pin elevator 50 is raised so that the heads 56 make contact with a lower surface of the substrate, and lifts the substrate off the blade 70. The transfer blade 70 is then removed through the slit valve opening 32. The susceptor 16 remains stationary throughout this process. With the pin elevator 50 remaining stationary, the susceptor elevator 52 is then raised. Raising of the susceptor elevator 52 causes movement of the susceptor 16 in a vertically upward direction, while the pins 48 slide along the openings in the susceptor 16. The susceptor 16 is raised until an upper surface 72 of the susceptor 16 makes contact with a lower surface of the substrate. The susceptor 16 is then further elevated until an upper surface of the substrate is at a required distance from the gas dispersion plate 38. In one embodiment, the upper surface of the substrate is at a distance of approximately 14 mm from the gas dispersion plate 38.

In one embodiment, a current is provided to a resistive heater 76 (see FIG. 2) located within the susceptor 16. In one embodiment, the susceptor 16 can be made out of ceramic, graphite, aluminum, or other suitable material, preferably, ceramic. The current heats the resistive heater 76, and the heat conducts from the resistive heater 76 through the susceptor 16 to a substrate. In one embodiment, a thermocouple 78 (see FIG. 2) is located within the susceptor 16, and provides temperature feedback for purposes of controlling the temperature of the susceptor 16 and, indirectly, the temperature of the substrate. In one embodiment, the temperature of the substrate is approximately 20° C. lower than the temperature measured at the susceptor 16.

In one embodiment, the chamber 12 has a reacting space 47. The reacting space 47 is the area between the dispersion plate 38 and the susceptor 16. In one embodiment, the reacting space 47 has a volume of about 750 $cm^3$, which is the dispersion plate area times the distance between the dispersion plate 38 and the susceptor 16. In another embodiment, the chamber 12 has an inner volume 24 of about 5 to 7 litters.

Figure 3A:
FIGS. 3A to 3H illustrate cross-sectional side views of a semiconductor device that can be formed using some of the exemplary embodiments of the present invention.

FIGS. 3A–3H illustrate an exemplary process of making a semiconductor device such as a FLASH memory, a capacitor, or a transistor in accordance with the embodiments of the present invention. FIG. 3A illustrates a cross-sectional portion of a substrate 102 where upon a device can be formed. In one embodiment, the substrate 102 is made out of monocrystalline silicon. In one embodiment, the substrate 102 is a silicon wafer. The substrate 102 may include a thin film of epitaxial silicon.

Figure 3B:

A thin silicon dioxide insulation film 104 (e.g., a gate dielectric film) is formed on an upper surface of the substrate 102 as illustrated at FIG. 3B. In an embodiment where the substrate 102 includes the epitaxial silicon film, the insulation film 104 is formed on the epitaxial silicon film. The insulation film 104 is typically less than 25 Å thick. In one embodiment, the insulation film 104 is formed to contain may be made of silicon dioxide, nitrided silicon dioxide, or another dielectric material such as a high-k material. In one embodiment, to form the insulation film 104, conventional method such as thermal oxidation can be used.

Figure 3C:
Figure 4:
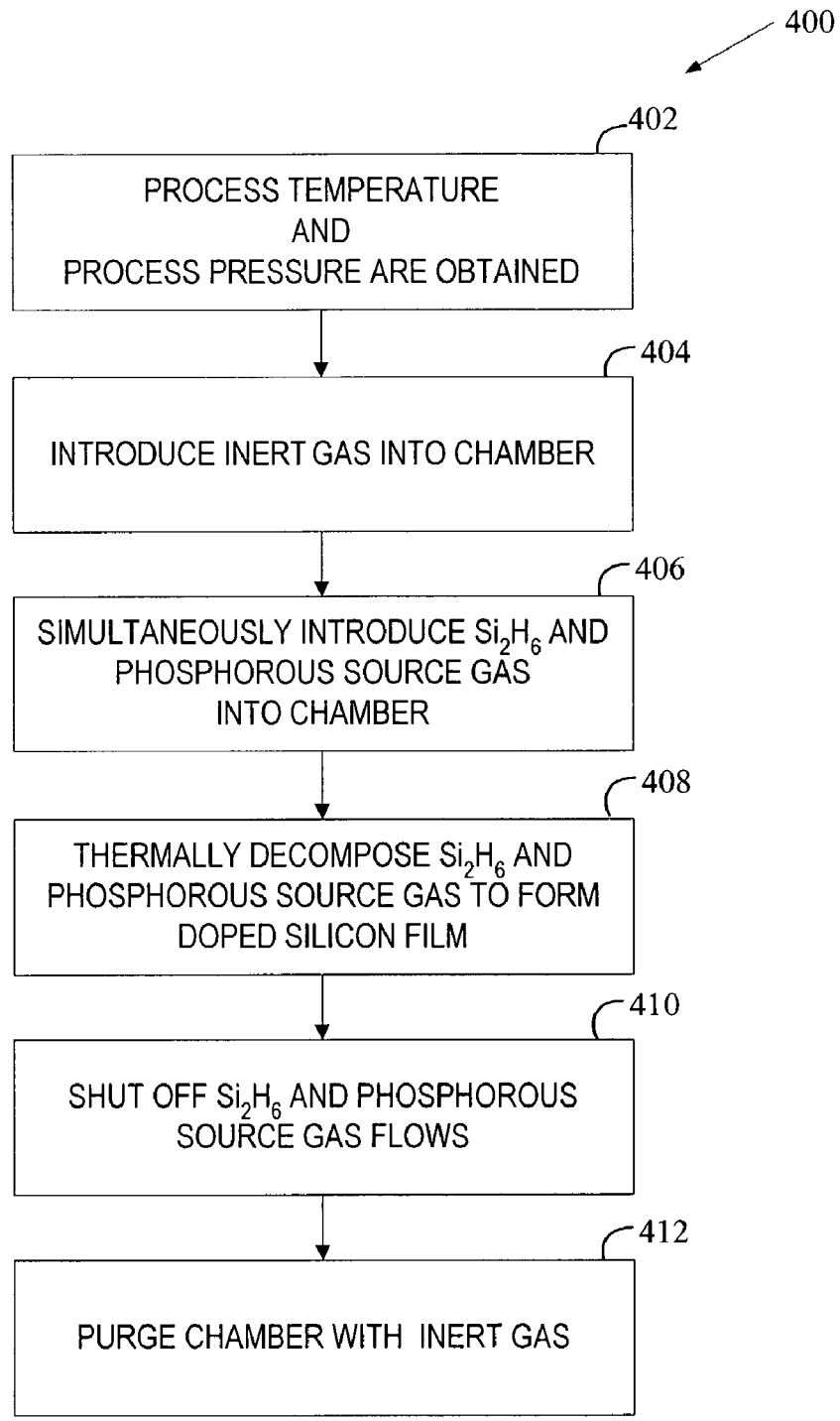
FIG. 4 illustrates an exemplary method of fabricating a doped silicon comprising film wherein disilane and phosphine are used as reactant gases.

Next, a lightly phosphorous doped silicon film 106 is formed directly on the exposed upper surface of the insulation film 104 as illustrated in FIG. 3C. In one embodiment, the lightly phosphorous doped silicon film 106 is a floating gate of a FLASH memory device. In one embodiment, an exemplary method 400 is used to form the lightly phosphorous doped silicon film 106. The method 400 is illustrated in illustrated in FIG. 4.

In one embodiment, the substrate 102 is placed in the chamber 12 described above. In one embodiment, the substrate 102 is positioned at approximately 13 mm from the gas dispersion plate 38 as hereinbefore described. A process temperature and a process pressure are obtained at operation 402. In one embodiment, the process pressure is between 30 Torr and 350 Torr. The process temperature is between 480° C. and 630° C.

Next, an inert gas such as an $N_2$ gas is introduced into the chamber 12 at operation 404 to equilibrate the chamber 12. The $N_2$ gas is introduced through the inlet ports 26 and 28. Through the gas inlet port 26, the $N_2$ gas is introduced into the top of the chamber 12 and in one embodiment, with a flow rate of approximately 6000 standard cubic centimeters per minute (sccm). Through the gas inlet port 28, the $N_2$ gas is introduced into the bottom of the chamber 12 and in one embodiment, with a flow rate of approximately 2000 sccm. In one embodiment, the flow rates for the $N_2$ gas flows through the inlet port 26 and 28 may a range from about 2000 sccm to about 10,000 sccm.

At operation 406, a disilane gas and a phosphorous source gas (e.g., phosphine ($PH_3$) gas) are simultaneously introduced into the chamber 12. In one embodiment, the disilane gas is pure (not diluted) and is introduced into the chamber 12 at a relative flow rate ranging from 20 sccm to 200 sccm, and ideally, 60 sccm. The flow rate of the disilane gas can be varied depending on the size of the chamber 12. In one embodiment, the flow rate of the disilane gas is selected for the chamber 12 that has the inner volume 24 with a volume between 5–7 litters and the reacting space 47 of about 750 $cm^3$. Additionally, the relative flow rate of the disilane gas can be varied depending on the desired thickness of the film. Generally, the relative flow rate of the disilane gas is higher for a thicker film than for a thinner film.

In on embodiment, the phosphorous source gas is diluted with a dilution/carrier gas, which is an inert gas such as hydrogen ($H_2$) gas to form a diluted phosphorous source gas. When the phosphorous source gas is $PH_3$, the diluted phosphorous source gas is a diluted $PH_3$ gas. Other inert gases that can be used to dilute the phosphorous source gas may include an $N_2$, an Ar gas, and a Xe gas. In one embodiment, the diluted phosphorous source gas contains approximately 1.0% of the phosphorous source gas and approximately 99% of the hydrogen gas. In another embodiment, the diluted phosphorous source gas contains anywhere from 0.10% to 10% of the phosphorous source gas. The relative flow rate for the diluted phosphorous source gas is between 20 sccm and 300 sccm, and ideally, 90 sccm. In one embodiment, the flow rate of the diluted phosphorous source gas is selected for the chamber 12 that has the inner volume 24 with a volume between 5–7 litters and the reacting space 47 of about 750 $cm^3$.

In another embodiment, the relative flow rate of the diluted phosphorous source gas can be adjusted according to the concentration of the phosphorous in the diluted phosphorous source gas. When the phosphorous source gas is the pure (or undiluted) phosphorous source gas, the relative flow rate of this phosphorous source gas is small in order to achieve a particular desired phosphorous doping concentration. When the phosphorous source gas is diluted, the relative flow rate for the diluted phosphorous source gas is higher than that for the undiluted phosphorous source gas to achieve the particular desired phosphorous doping concentration.

For instance, to form a lightly phosphorous doped silicon film, (e.g., with a dopant concentration less than $1 \times 10^{20}$ atoms/$cm^3$, the relative flow rate for the pure or undiluted phosphorous source gas has to be much less than 1–2 sccm for the chamber 12 with the inner volume 24 volume between 5–7 litters and the reacting space 47 of about 750 $cm^3$. Controlling or metering such a low flow rate into the chamber 12 is extremely difficult and often results in non-uniformity of the phosphorous dopant in the final film. In another embodiment, the phosphorous source gas is the diluted phosphorous source gas in the range of 0.1% to 10% as mentioned above. Since it is easier to control the relative flow rate of a more diluted phosphorous source gas than the less diluted phosphorous source gas, it is preferred that the phosphorous source gas be as diluted as possible.

It is to be appreciated that the flow rate of disilane gas, the phosphorous source gas, the diluted phosphorous source gas, the inert gas, or any other gases that are introduced into the chamber 12 is relative to the volume of the chamber 12.

At operation 408, the disilane and the phosphorous source gases are thermally decomposed to form the lightly phosphorous doped silicon film 106. Once a sufficiently thick lightly phosphorous doped silicon film 106 is deposited, the disilane and the phosphine gases are shut off as illustrated at operation 410. In one embodiment, the lightly phosphorous doped silicon film 106 that is formed is a polysilicon film. In one embodiment, the deposition of the lightly phosphorous doped silicon film 106 is continued for approximately 45 seconds, so that the lightly phosphorous doped silicon film 106 is approximately 2000 Å thick. The time for deposition may be varied according to the desired thickness for the lightly phosphorous doped silicon film 106. In another embodiment, the lightly phosphorous doped silicon film 106 may be between 500 Å and 2000 Å thick.

In one embodiment, the chamber 12 is purged with an inert gas such as an $N_2$ gas as illustrated at operation 412.

One advantage of using the disilane gas in forming the lightly phosphorous doped silicon film 106 is that more of the phosphorous source gas or the diluted phosphorous source gas can be used. It is easier to form the lightly phosphorous doped silicon film with a phosphorous doping concentration less than $1 \times 10^{20}$ atoms/$cm^3$.

Disilane has a faster reaction rate than monosilane. The silicon atoms in the disilane thus incorporate into the film at a faster rate than in the case of monosilane. The deposition rate is thus faster. In order to allow the phosphorous atoms in the phosphorous source gas to be incorporated into the film, more of the phosphorous source gas is required. The increased amount of the phosphorous source gas leads to the need for a higher relative flow rate for the phosphorous source gas. In one embodiment, requiring more phosphorous source gas makes it easier to control the relative flow rate of the phosphorous source gas that is introduced into the chamber 12. In one embodiment, when disilane is used, the phosphorous source gas needed is at least one order of magnitude greater than when monosilane is used to achieve the same phosphorous doping concentration in the doped film (see FIG. 5 discussion). The ability to use more phosphorous source gas in the film deposition process thus gives a better and more accurate control of uniformity of the phosphorous doping concentration in the final film.

Furthermore, when higher phosphorous amount is needed, the film deposition process is not sensitive to and/or impacted a small deviation in the amount of the phosphorous source gas or the diluted phosphorous source gas that is used. In one embodiment, when more of the amount of the phosphorous is used, the impact by the out-gassing experiences by the film being formed in the chamber 12 is much smaller. Out-gassing occurs when some of the phosphorous atoms from the phosphorous source gas or the diluted phosphorous source gas that got absorbed to the surfaces inside the chamber 12, for example, during the initialization process or due to other factors, get released or desorbed from the surfaces. These phosphorous atoms may incorporate themselves into the film that is being formed. The impact by the out-gassing is minimized when more of the phosphorous source gas or the diluted phosphorous source gas can be introduced into the chamber 12.

When monosilane is used, it is difficult to control the relative flow rate of the phosphorous source gas or the diluted phosphorous source gas, which needs to be very small. Hence, it is much more difficult to control or obtain the desirable concentration of the phosphorous doping concentration in the final film. Lacking the ability to control the phosphine doping concentration, the film dopant is less uniform. It is also much more difficult to repeat the dopant concentration across the substrate. The non-uniform dopant concentration observed from substrate to substrate, or wafer to wafer, becomes a bigger problem when a single-wafer deposition chamber is used to form the lightly phosphorous doped silicon film.

Figure 5:
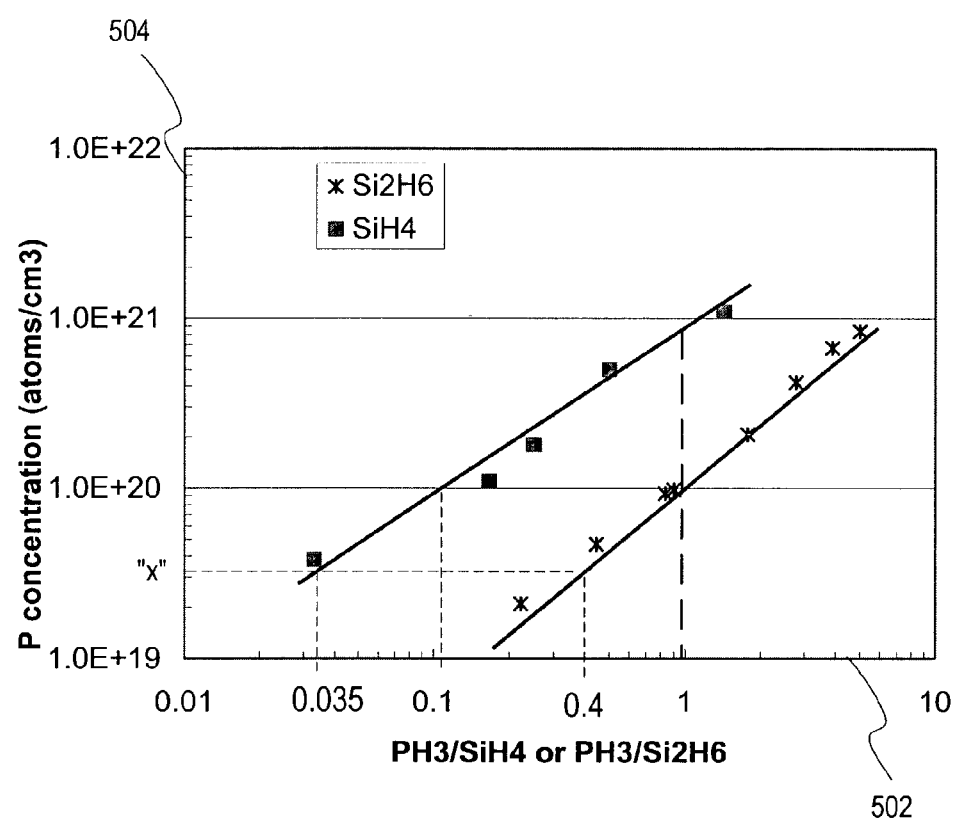
FIG. 5 illustrates a comparison of flow ratio effect between monosilane/phosphine and disilane/phosphine. In this figure, the phosphine is diluted to 1% phosphine in hydrogen ($H_2$) gas.

FIG. 5 illustrates in more details the impact of the flow ratio of the disilane gas and the phosphorous source gas on the phosphorous doping concentration. In one embodiment, the flow ratio of the phosphorous source gas and disilane gas in the chamber 12 determines the phosphorous doping concentration on a film. FIG. 5 further illustrates the different in flow ratio requirements when monosilane is used versus when disilane is used to form a film that is doped with phosphorous.

In one embodiment, FIG. 5 pertains to the impact of the flow ratio of the phosphorous source gas and the disilane gas wherein the phosphorous source gas is a 1% diluted phosphorous source gas (1% phosphorous and 99% $H_2$ gas). The discussion herein of FIG. 5 is similarly applied to the case where the phosphorous source gas is pure or undiluted. The axis 502 indicates the flow ratio of the 1% diluted phosphorous source gas and the disilane ($Si_2H_6$) gas. The axis 502 also indicates the flow ratio of the 1% diluted phosphorous source gas and the monosilane ($SiH_4$) gas. The axis 504 indicates the concentration (atoms/cm$^3$) of the phosphorous dopant in the film (e.g., a phosphorous doped silicon film) that is formed using these gases.

In one embodiment, when the monosilane gas is used, to form a film with a phosphorous doping concentration of $1\times10^{20}$ atoms/cm$^3$, the flow ratio for the 1% diluted phosphorous source gas and the monosilane gas is 1:10 (or 0.1). When the disilane gas is used, to form a film with a phosphorous doping concentration of $1\times10^{20}$ atoms/cm$^3$, the flow ratio for the 1% diluted phosphorous source gas and the disilane gas is 1:1 (or 1). In another embodiment, when the monosilane gas is used, to form a film with a phosphorous doping concentration of less than $1\times10^{20}$ atoms/cm$^3$, for instance, a phosphorous doping concentration "X", the flow ratio for the 1% diluted phosphorous source gas and the monosilane gas is 3.5:100 (or 0.035). When the disilane gas is used, to form a film with the same phosphorous doping concentration "X", the flow ratio for the 1% diluted phosphorous source gas and the disilane gas is 4:10 (or 0.4).

Alternatively, for the same amount of phosphorous source gas, when monosilane is used, the film that is formed has a higher phosphorous doping concentration than when disilane is used. For instance, when the flow ratio of the 1% diluted phosphorous source gas and the disilane gas is 1:1 (or 1), the film formed has a phosphorous doping concentration of slightly less than $1\times10^{20}$ atoms/cm$^3$. On the other hand, when the flow ratio of the 1% diluted phosphorous source gas and the monosilane gas is 1:1 (or 1), the film formed has a phosphorous doping concentration of nearly $1\times10^{21}$ atoms/cm$^3$, which is almost an order of magnitude greater than when disilane is used.

As can be seen, FIG. 5 illustrates that in order to reach the same phosphorous doping concentration, the flow ratio of the 1% diluted phosphorous source gas and the disilane gas is about one (1) order of magnitude greater than that of the 1% diluted phosphorous source gas and the monosilane gas. In other words, more phosphorous is needed to reach a desired phosphorous doping concentration in the case of a disilane than in the case of monosilane. Controlling a greater amount of phosphorous, especially when making the lightly doped films (dopant concentration less than $1\times10^{20}$ atoms/cm$^3$). Furthermore, when more phosphorous is required, it is easier to obtain a more stable and repeatable process from wafer to wafer. The uniformity in film thickness is also dramatically improved, as it is much easier to obtain controllable and repeatable amount of phosphorous for the doping.

Figure 3D:

Following FIG. 3C, a control oxide film 108 is formed as shown in FIG. 3D. The control oxide film 108 is a dielectric film that is formed over the lightly phosphorous doped silicon film 106. In one embodiment, the control oxide film 108 is a silicon dioxide film formed using conventional methods.

Alternatively, the control oxide film 108 can be formed in the same chamber 12 immediately following the formation of the lightly phosphorous doped silicon film 106 described above. In one embodiment, to form the oxide film 108 immediately after the lightly phosphorous doped silicon film 106 is formed, the phosphorous source gas flow is shut off while the disilane gas flow is continued. An oxidation source gas (e.g., nitrous oxide ($NO_2$) and ozone ($O_3$)) is introduced into the chamber 12. The disilane gas and the oxidation source gas are decomposed to form the control oxide film 108.

In another embodiment, immediately following the forming of the lightly phosphorous doped silicon film 106, both the disilane gas and the phosphorous source gas flows are shut off. Another silicon source gas such as monosilane is introduced into the chamber 12 together with the oxidation source gas to form the control oxide film 108. Although disilane gas is not the only silicon source gas that can be used to form the control oxide film 108, it may be convenient to use the disilane gas when the control oxide film 108 is formed immediately after the lightly phosphorous doped silicon film 106 is formed.

Figure 3E:
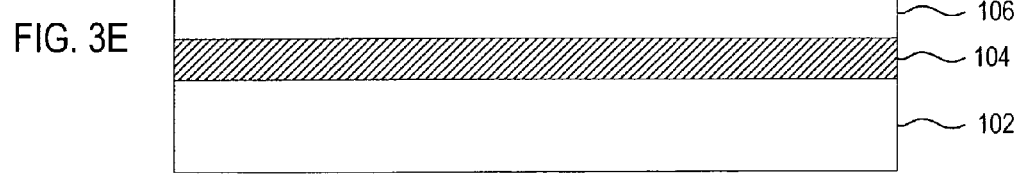

Next, a control gate 110 is formed over the control oxide film 108 as shown in FIG. 3E. In one embodiment, the control gate 110 is a heavily doped polysilicon film. The control gate 110 can be formed using methods to form a heavily doped polysilicon film. In one embodiment, the control gate 110 is formed using the method 400 described above in FIG. 4. In this embodiment, the phosphorous source gas or the diluted phosphorous source gas to be introduced into the chamber 12 is increased so as to form a film that is heavily doped with phosphorous.

Figure 3F:
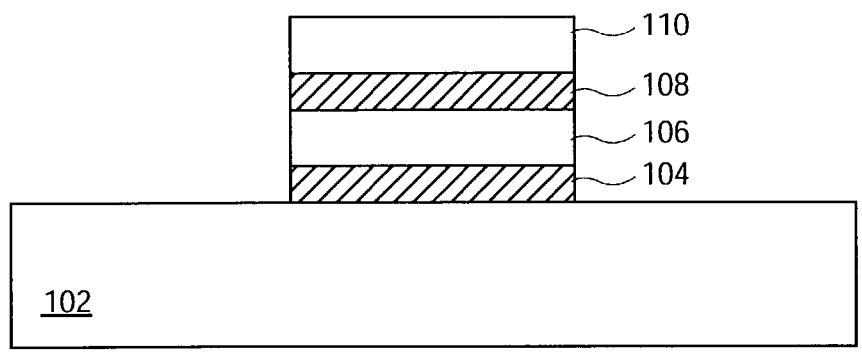

Next, conventional etching methods such as photolithography and reactive ion etching processes can be used to form the structure shown in FIG. 3F. In one embodiment, FIG. 3F illustrates a film stack that is used to form a device such as a FLASH memory device.

Figure 3G:
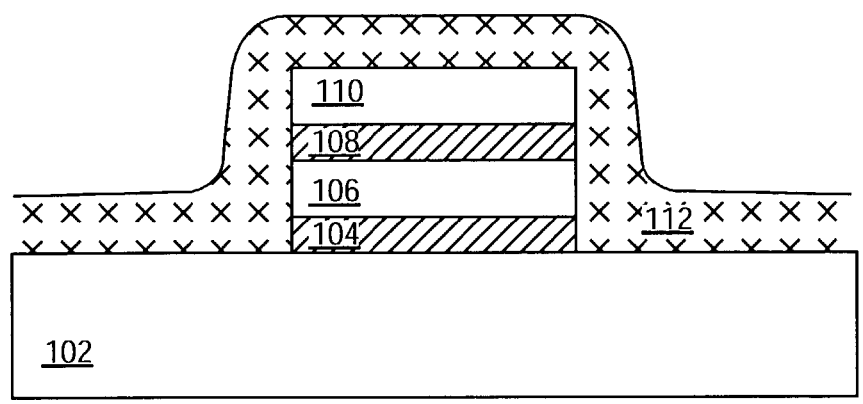
Figure 3H:
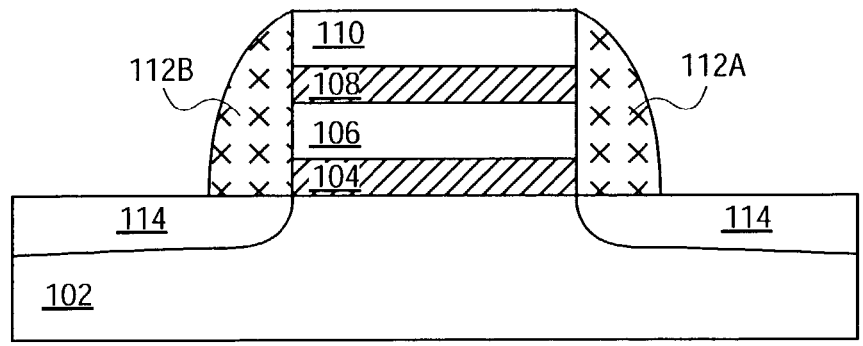

Next, a dielectric film 112 such as silicon dioxide is deposited (blanket/conformal deposition) over the structure as shown in FIG. 3G. A conventional method such as anisotropic reactive ion etching is used to etch the dielectric film 112 to form the sidewalls 112A and 112B as shown in FIG. 3H. Additionally, source and drain regions 114 can be formed using conventional method to give the final structure of the FLASH memory device (e.g., a FLASH memory device) as illustrated in FIG. 3H.

In one embodiment the various films discussed above are formed in situ, in one deposition chamber. There is no need to change temperature for the formation of the different films for a the semiconductor device. Not having the need to change the temperature between depositions the different films is extremely useful when the films are formed in a resistively heated single wafer deposition where controlling the temperature is more complicated. Further, not needing to change the temperature between depositions of different films allows fast fabrication of the semiconductor device.

Figure 6:
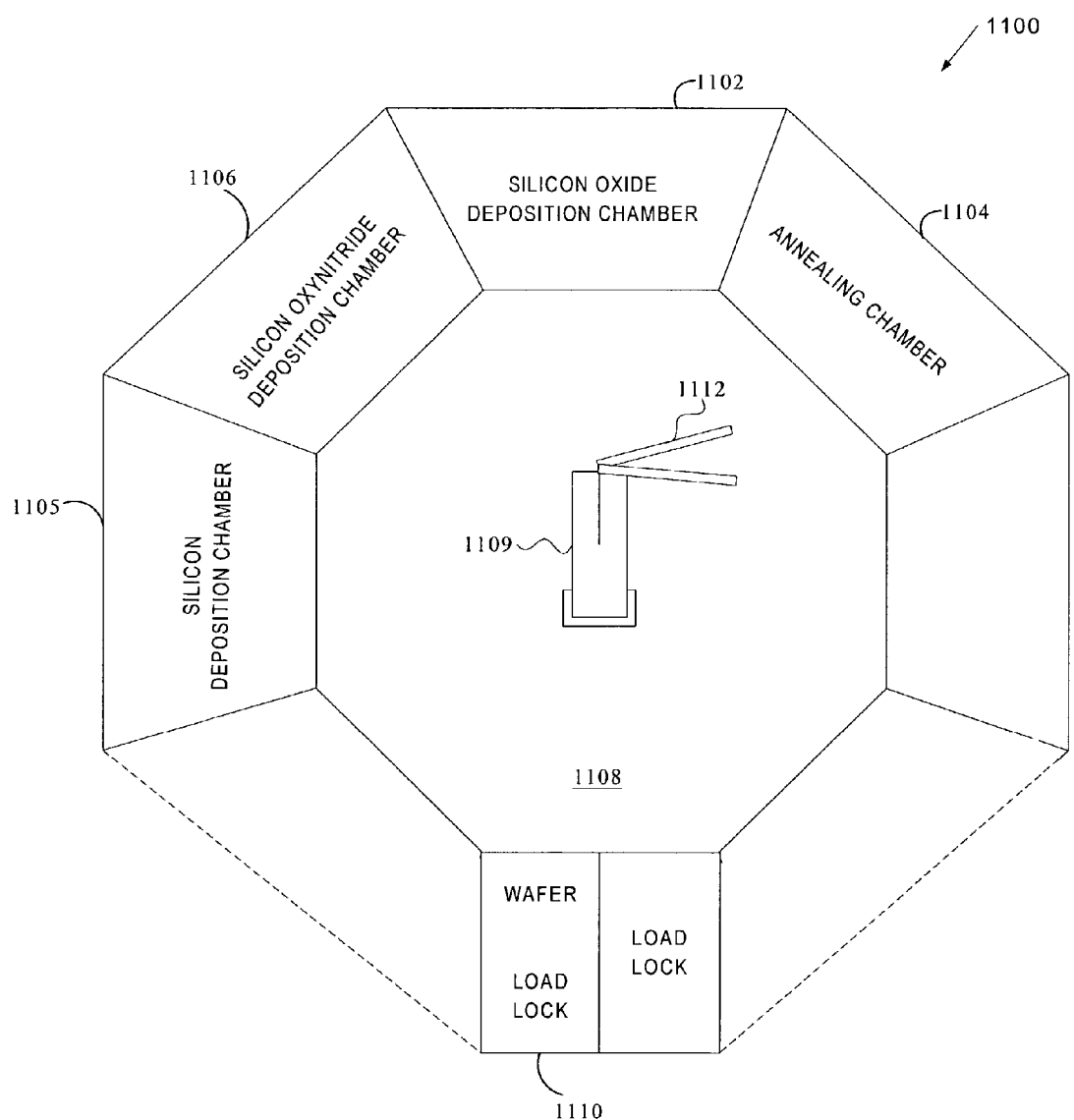
FIG. 6 illustrates cluster tool that can be used for some of the embodiments of the present invention.

In another embodiment, the various films described above are formed in different chambers that are arranged into a cluster tool. FIG. 6 illustrates an exemplary cluster tool 1100 that includes several processing chambers. For example, the cluster tool 1100 includes a silicon oxide deposition chamber 1102, an annealing chamber 1104, a silicon deposition chamber 1105, and a silicon oxynitride deposition chamber 1106. In one embodiment, each of the silicon oxide deposition chamber 1102, the silicon deposition chamber 1105, and the silicon oxynitride deposition chamber 1106 is a reaction chamber like the chamber 12 described above.

The cluster tool 1100 also includes a transfer chamber 1108 having a wafer handler 1109 (e.g., a robot assembly), which includes a wafer clip 1112 for handling a wafer (or a substrate) that is to be deposited into one of the chambers mentioned above. The wafer clip 1112 can be the transfer blade 70 described above in FIG. 2. The transfer chamber 1108 is further coupled to a load lock system 1110, which stores the substrates to be processed. In one embodiment, the wafer handler 1109 removes a substrate from the load lock system 1110 and places the substrate into an appropriate chamber depending on a process protocol. The wafer handler 1109 also removes a substrate from the chamber once the processing is completed and moves the substrate to the next processing chamber or into the load lock system 1110.

The transfer chamber 1108 is typically set at a reduced pressure as compared to the atmospheric condition. In one embodiment, the transfer chamber 1108 can also be set at a pressure close to the process pressure that the chambers will be operating at. In another embodiment, the cluster tool 1100 is also set at a pressure that once the wafers are in the load lock system 1110, the loading of other substrates into other chambers does not impact the operating conditions inside each chamber. When multiple processes are involved, the wafer handler 1109 is used to move the substrate from one chamber to the next chamber for each process.

In one embodiment, to deposit a film such as the lightly phosphorous doped silicon film 106 discussed above, the wafer handler 1109 removes a substrate from the load lock 1110 and places the substrate in the silicon deposition chamber 1105. The film is then formed using, for example, the method 400 discussed above in FIG. 4. Once the film is formed, the wafer handler 1109 removes the substrate from the chamber 1105. In another embodiment, the wafer handler 1109 may place the substrate into the chamber 1104 for annealing.

The exemplary embodiments can be used to form as many films on a substrate as necessary. For example, the reactant and the doping gases can be varied depending on the composition of the films to be formed. Thus, the exemplary embodiments above can be repeated as often as necessary to form as many films as needed. Furthermore, multiple films can be formed simultaneously on multiple substrates using the cluster tool 1100.

In another embodiment, the system 10 shown in FIG. 1, the system 10 includes the processor/controller 64 and the memory 66, such as a hard disk drive. The processor/controller 64 may include a single board (SBC) analog and digital input/output boards, interface boards and stepper motor controller board. The processor/controller 64 controls all activity of the system 10. The system controller executes system control software, which is a computer program stored in a computer readable medium such as the memory 66. The memory 66 can be stored in a hard disk, a floppy disk, a compact disc ROM (CD-ROM), a digital video disc (DVD-ROM), a magnetic optical disk, or any other types of media suitable for storing electronic instructions. The computer program includes sets of instructions that dictate the timing, mixture of gases, chamber pressure, heater temperature, power supply, susceptor position, and other parameters of the film deposition processes of the present invention. The computer program code can be written in any conventional computer readable programming language such as 68000 assembly language, C, C++, Pascal, Fortran, or others. Subroutines for carrying out process gas mixing, pressure control, and heater control are stored within the memory 66. Also stored in the memory 66 are process parameters such as process gas flow rates and compositions, temperatures, and pressures necessary to form the films of the exemplary embodiments.

Thus, according to an exemplary embodiment of the present invention, instructions for process parameters for forming the silicon comprising films are stored in the memory 66. In another exemplary embodiment, the instructions provide for when and how much of the reactant gases (e.g., the disilane gas, and the phosphorous source gas) are to be introduced into the chamber 12. The instructions also provide for the flow ratios of the reactant gases. Further yet, the instructions also provide how much, how hot, and when to heat the chamber 12 or the susceptor 16 in the chamber 12. The instructions also provide for the controlling of the pressure of the chamber 12. The instructions also provide for independent control and variation of the flow rates of each of the reactant gases and the dilution/carrier gas that are introduced into the chamber 12.

In another exemplary embodiment, the cluster tool 1100 of FIG. 6 also includes a processor/controller 64 and a memory 66 (not shown in FIG. 6) similar to that included in the system 10 described above. In addition to the functions of the instructions as described for the system 10, the instructions here further provide for the operation of moving the substrate(s) in and out of any particular chamber in the cluster tool 1100 for processing and other operation pertaining to operating the cluster tool 1100.

The instructions thus provide or control for most if not all of the operations of the deposition processes for the films in the system 10 or in the cluster tool 1100.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method of forming a lightly phosphorus doped silicon film comprising:
   placing a substrate in a single-wafer deposition chamber;
   introducing a phosphorus source gas and a disilane gas into said single-wafer deposition chamber, wherein said phosphorus source gas and said disilane gas have a first flow ratio less than 1:100; and
   thermally decomposing said disilane gas and said phosphorus source gas at a pressure ranging from about 30 Torr to 350 Torr to form said lightly phosphorus doped silicon film which has a phosphorus doping concentration less than $1 \times 10^{20}$ atoms/cm$^3$.

2. A method as in claim 1 further comprises mixing said disilane gas with a dilution gas prior to introducing said disilane gas into said single-wafer deposition chamber.

3. A method as in claim 1 further comprising:
   diluting said phosphorus source gas with a dilution gas to form a diluted phosphorus source gas wherein said prior to introducing said phosphorus source gas into said single-wafer deposition chamber.

4. A method as in claim 3 wherein said phosphorus source gas contained in said diluted phosphorus source gas has a concentration between 0.1% and 10%.

5. A method as in claim 1 further comprises maintaining said deposition chamber in a process temperature ranging between 500° C. to 650° C.

6. A method as in claim 1 wherein said single-wafer deposition chamber is a resistively heated single-wafer deposition chamber.

7. A method as in claim 1 further comprises annealing said substrate using a thermal annealing process.

8. A method as in claim 1 further comprises forming said lightly phosphorus doped silicon film at a deposition rate ranging from 1000 Å/min to about 3000 Å/min.

9. A method as in claim 1 wherein said phosphorus source gas is phosphine (PH$_3$).

10. A method of forming a lightly phosphorus doped silicon film comprising:
　placing a substrate in a single-wafer deposition chamber;
　introducing a phosphorus source gas and a disilane gas into said single-wafer deposition chamber, wherein said phosphorus source gas and said disilane gas have a first flow ratio less than 1:100; and
　thermally decomposing said disilane gas and said phosphorus source gas at a pressure ranging from about 30 Torr to 350 Torr to form said lightly phosphorus doped silicon film which has a phosphorus doping concentration less than $1\times10^{20}$ atoms/cm$^3$; and
　diluting said phosphorus source gas with a dilution gas to form a diluted phosphorus source gas prior to introducing said phosphorus source gas into said single-wafer deposition chamber,
　wherein said phosphorus source gas contained in said diluted phosphorus source gas has a concentration between 0.1% and 10%, and
　wherein said diluted phosphorus source gas has a concentration of about 1% and wherein said diluted phosphorus source gas and said disilane gas and has a second flow ratio between 1:10 and 15:10.

11. A method as in claim 10 further comprises varying said second flow ratio to vary said phosphorus doping concentration.

12. A method as in claim 10 further comprising:
　introducing said disilane gas at a disilane gas flow rate; and
　introducing said diluted phosphorus source gas at a phosphorus gas flow rate.

13. A method as in claim 12 further comprising:
　controlling said second flow ratio by varying said phosphorus gas flow rate and said disilane gas flow rate.

14. A method of forming a semiconductor device comprising:
　placing a substrate in a single-wafer deposition chamber;
　maintaining a process temperature between 500° C. and 650° C. and a process pressure between 30 and 350 Torr;
　introducing a phosphorus source gas and a disilane gas into said single-wafer deposition chamber, said phosphorus source gas and said disilane source gas have a flow ratio less than 1:100;
　thermally decomposing said disilane gas and said phosphorus source gas in said single-wafer deposition chamber using a thermal energy source to form a lightly phosphorus doped silicon film above said substrate, said lightly phosphorus doped silicon film has a phosphorus doping concentration less than $1\times10^{20}$ atoms/cm$^3$;
　cutting off said phosphorus source gas while introducing an oxidation source gas into said single-wafer deposition chamber; and
　thermally decomposing said disilane gas and said oxidation source gas using said thermal energy source to form a silicon oxide film above said lightly phosphorus doped silicon film.

15. A method as in claim 14 further comprising:
　cutting off said oxidation source gas while re-introducing said phosphorus source gas into said single-wafer deposition chamber; and
　thermally decomposing said disilane gas and said phosphorus gas in said single-wafer deposition chamber using said thermal energy source to form a doped phosphorus silicon film above said silicon oxide film wherein said doped phosphorus silicon film has a higher dopant concentration than said lightly phosphorus doped silicon film.

* * * * *